(12) United States Patent
Lewyn

(10) Patent No.: US 6,236,273 B1
(45) Date of Patent: May 22, 2001

(54) HIGH EFFICIENCY POWER AMPLIFIER

(75) Inventor: Lanny L. Lewyn, Laguna Beach, CA (US)

(73) Assignee: Pairgain Technologies, Inc., Tustin, CA (US)

( * ) Notice: Subject to any disclaimer, the term of this patent is extended or adjusted under 35 U.S.C. 154(b) by 0 days.

(21) Appl. No.: 09/442,583

(22) Filed: Nov. 18, 1999

(51) Int. Cl.$^7$ ............................................ H03F 3/04
(52) U.S. Cl. .................... 330/297; 330/267; 323/314
(58) Field of Search ................................... 330/297, 267; 323/314; 327/309, 321

(56) References Cited

U.S. PATENT DOCUMENTS

| | | | | |
|---|---|---|---|---|
| 4,378,530 | * | 3/1983 | Garde | 330/297 |
| 5,898,342 | * | 4/1999 | Bell | 330/297 |
| 6,028,486 | * | 2/2000 | Andre | 330/297 |

* cited by examiner

Primary Examiner—Michael B Shingleton
(74) Attorney, Agent, or Firm—Jeffrey Slusher

(57) ABSTRACT

A monolithic integrated circuit amplifier has a gain stage and a buffer stage. The buffer stage includes an output stage and two separate voltage supplies, the second of which has a greater magnitude than the first. Switching circuitry is included that is connected to the output stage via a regulator bus. When an output demand voltage is less than a switch-over threshold, current to the output stage is provided substantially entirely from the first voltage supply; when the output demand voltage is greater than the switch-over threshold, current to the output stage is provided substantially entirely from the second voltage supply. Collector voltage at the output stage can be maintained greater than the emitter voltage by a predetermined, substantially constant amount. Voltage headroom circuitry is preferably also included for setting a voltage headroom, that is, the lowest voltage constantly available at the second current terminal of the output transistor relative to the first current terminal of the output transistor.

23 Claims, 4 Drawing Sheets

HIGH EFFICIENCY POWER AMPLIFIER

BACKGROUND OF THE INVENTION

1. Field of the Invention

This invention relates to power amplifiers and more particularly to high-power, monolithic, integrated circuit (IC) power amplifiers.

2. Background Art

Certain telecommunications standards have been developed in the United States to provide high-speed digital access between customers and a central office. One example is the Asymmetric Digital Subscriber Loop (ADSL) standard, which provides a data rate of approximately 6 Mb in the direction from the central telephone office to the customer. As a result of the high data rate, ADSL has become one of the preferred standards for supplying, for example, Internet service over a standard copper wire twisted pair.

Although it offers a high data rate, the ADSL standard requires that the line-driving amplifier at the central office be able to supply a signal of approximately 20 dBm (power with respect to a reference level of 1 mW) in power with a peak-to-rms average voltage ratio (PAR) of 5.33:1. In order to accommodate the required power output level and PAR, two line-driving amplifiers, or a line-driver pair, are commonly used in a bridge configuration with a 1:2 step-up transformer between the amplifiers and the line.

One disadvantage of this conventional arrangement is its need for power as the number of customers grows. In the near future, for example, it is expected that several thousand customers may require ADSL service from the same central office. The possibility of expending several kilowatts of power just to operate the ADSL lined rivers has therefore become a major concern regarding this type of digital service. Much research effort has therefore been applied to the problem of increasing the efficiency of monolithic, integrated circuit (IC) power amplifiers for ADSL applications.

In one known circuit arrangement, the output stage of an operational amplifier is connected to an approximately constant supply voltage, whose supply voltage is greater in magnitude than the maximum zero-to-peak output voltage. The amount by which the supply voltage exceeds the maximum output voltage is commonly known as the voltage headroom required for the stage. For example, a typical value for the voltage headroom in prior art circuits is 3V. The zero-to-peak voltage for an ADSL amplifier in the central office is approximately 8.42V. The minimum power supply voltage for such an arrangement would therefore be approximately 11.42V. The supply voltage, given some initial voltage setting inaccuracy, may therefore be nominally 12V.

Because the average current required from each power supply (+/−12V) in the amplifier pair is approximately 28.5 mA for the ADSL central office, the minimum power possible for a 12V supply would be 4×12V×28.5 mA=1.36 W. This would be the minimum power given ideal "Class C" operation of the output stage and without providing additional power for any amplifier current bias circuits. Because ADSL power amplifiers require low output distortion— typically better than 70 dB for signal to noise-and-distortion ratios—"Class C" operation is not practical. It is therefore understandable why, despite considerable efforts, it has not been possible to reduce power consumption for ADSL central office line driving amplifier pairs significantly below 1.5 W. Similar problems of course arise, or may arise, even in systems that use standards other than the ADSL for enabling data exchange between some central system and a number of customers or other client systems large enough that it becomes advantageous to reduce the need for supply power to the various amplifiers.

What is needed is therefore an arrangement that would make possible a reduction in the power level for the amplifier arrangement as much as possible, and preferably to below 1.0 W, especially for systems following the ADSL standard. This invention provides such an arrangement.

SUMMARY OF THE INVENTION

A monolithic integrated circuit amplifier according to the invention has an input signal and an output signal, as well as a gain stage. The gain stage has a gain stage output signal and, as an input, the amplifier input signal. A buffer stage produces an amplifier output signal and has, as its input signal, the gain stage output signal. An output stage, included within the buffer stage, has at least a first power output transistor.

First and second voltage supplies are included, the second voltage supply having a relatively higher magnitude than the first. A first power control circuit is connected to both the first and second voltage supplies, and to the output stage through a regulator bus. The first power control circuit includes first and second switching means connected to the first and second voltage supplies, respectively. Outputs of the first and second switching means are both connected to the regulator bus; these outputs are preferably the emitters (or MOS equivalents) of respective first and second analog switching transistors.

When an output demand voltage is less than a predetermined switch-over threshold, current to the output stage is provided substantially entirely from the first voltage supply via the first switching means and the regulator bus. When the output demand voltage is greater than the switch-over threshold, current to the output stage is provided substantially entirely from the second voltage supply, via the second switching means and the regulator bus.

According to one aspect of the invention, voltage at the collector (or MOS equivalent) of the output transistor is maintained greater than the voltage at the emitter (or MOS equivalent) of the output transistor by a predetermined, substantially constant amount.

According to another aspect of the invention, when the first switching means is conducting and supplying the current to the output stage, the voltage on the regulator bus itself blocks current output from the second switching means.

According to yet another aspect of the invention, a first and a second control transistor are included in the first and second switching means, respectively. Voltage clamping means is then preferably also provided for limiting a maximum voltage on the base of the first control transistor. This limits the maximum voltage on the base of the first analog switching transistor, and thereby also substantially prevents the flow of reverse current through the emitter and collector of the first analog switching transistor.

According to still another aspect of the invention, voltage headroom circuitry is also provided for setting a voltage headroom, that is, the lowest voltage constantly available at the second current terminal of the output transistor relative to the first current terminal of the output transistor.

The preferred embodiment of the invention also includes voltage difference-setting circuitry, the voltage difference being defined as the difference between the voltage available at the second current terminal of the output transistor relative to the first current terminal of the output transistor in a first condition and a second condition. The first condition is when the voltage is being provided by current from the first analog switching transistor and the second condition is when the voltage is being provided by current from the second analog switching transistor.

In the preferred embodiment of the invention, the first and second voltage supplies comprise a first dual voltage supply. The regulator bus connecting the first dual voltage supply to the output stage via the first power control circuit is thereby a first regulator bus. The amplifier then preferably further comprises a second dual voltage supply, including third and fourth voltage supplies having the same amplitudes but opposite polarity relative to the first and second voltage supplies, respectively; and a second power control circuit having the substantially identical components and connections but opposite polarities relative to the first power control circuit. The invention then further includes, in the buffer stage, a common output voltage terminal for both power control circuits.

For each power control circuit, there is then preferably provided: an output transistor that has an emitter, a collector, and a base (or MOS equivalents); an output resistor connected between the emitter of the output transistor and the voltage output terminal; an emitter-follower transistor connected to the respective second voltage supply and forming emitter-follower means for the respective output transistor; and an emitter-follower resistor connected between the emitter-follower transistor and the base of the output transistor. The output resistors and the emitter-follower resistors form distortion-reducing means for reducing second harmonic distortion caused by any differences in base and emitter in the emitters and the bases of the output transistors.

In the preferred embodiment of the invention, each power control circuit also has at least one voltage level-shifting transistor. The collector of the voltage level-shifting transistor in each power control circuit is preferably connected to the emitter of the control transistor in the other power control circuit, and vice versa. The collector current of the voltage level-shifting transistor in each power control circuit is thereby made available for use in the other power control circuit.

DETAILED DESCRIPTION

First, the major functional aspects of the invention are described below in order to provide the reader with a kind of "overview," which, it is hoped, will be helpful when studying the detailed circuit diagram of the preferred embodiment of the invention. Second, the general structure of two power amplifiers according to the prior art are briefly discussed. Third, the general structure of the operational amplifier according to the invention is described. Fourth, one actual circuit implementation of the preferred embodiment of the invention is described in detail.

Major functional aspects of the invention The invention reduces power levels for a high-power, monolithic, IC amplifier pair below 1.0 W through an approach that allows the current to the load to be provided most of the time, that is, with a high duty cycle, from a first, lower-voltage supply pair (such as, for example, +/−5V). A second, higher-voltage supply pair (such as, for example, +/−12V) provides the current to the load for only that small fraction of the operating duty cycle when the load voltage zero-to-peak value exceeds a predetermined switch-over threshold, for example, approximately 3.5 V. Here, "higher" and "lower" mean greater or smaller supply voltage magnitude.

The invention includes a voltage-switching design that minimizes the switching transient noise introduced into the output circuitry during the time when the output current source is being switched from the one of the voltage supplies of the lower-voltage supply pair to the one of the higher-voltage supply pairs or back from the second pair to the first. This is in part preferably accomplished by providing two intermediate voltage supplies. The voltages of these intermediate supplies are set, respectively, higher and lower than the instantaneous circuit output voltage.

The invention also includes a switching control circuit that works in combination with an output driver circuit to minimize the excess voltage headroom required at the voltage switching point. The switch-over between the first and second voltage pairs occurs at a reasonably high fraction of the first voltage. This results in a high duty cycle for the time that the load current is provided from the first supply voltage.

The switch-over arrangement according to the invention thereby wastes very little of the supply current from the second voltage supply. The invention also includes voltage clamp circuitry that prevents significant currents from flowing in the reverse direction through the switching circuits that are connected to the first supply voltage during the time that the output current is derived principally from the second voltage supply.

Two-stage power amplifiers

Figure 1A:
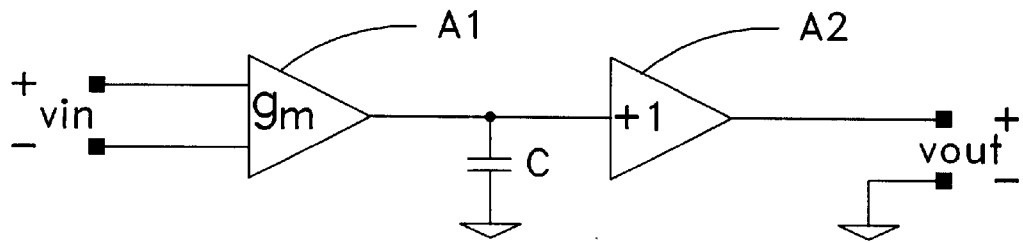
FIG. 1A is a greatly simplified illustration of a bipolar monolithic operational amplifier with a unity-gain output buffer stage.

FIG. 1A illustrates the general principle of a two-stage, monolithic, IC amplifier. An input gain stage comprises a first amplifier A1 with gain gm, whose input is the voltage input Vin and whose output current is, by definition, equal to gm·Vin. The output of this input gain stage is applied as the input to a unity-gain output buffer stage, which comprises a unity-gain element A2, the output of which forms the system output Vout. A capacitor C is often included within the input gain stage to connect the output of A1 (and thus the input of A2) to circuit ground in order to provide frequency compensation and stabilization.

Figure 1B:
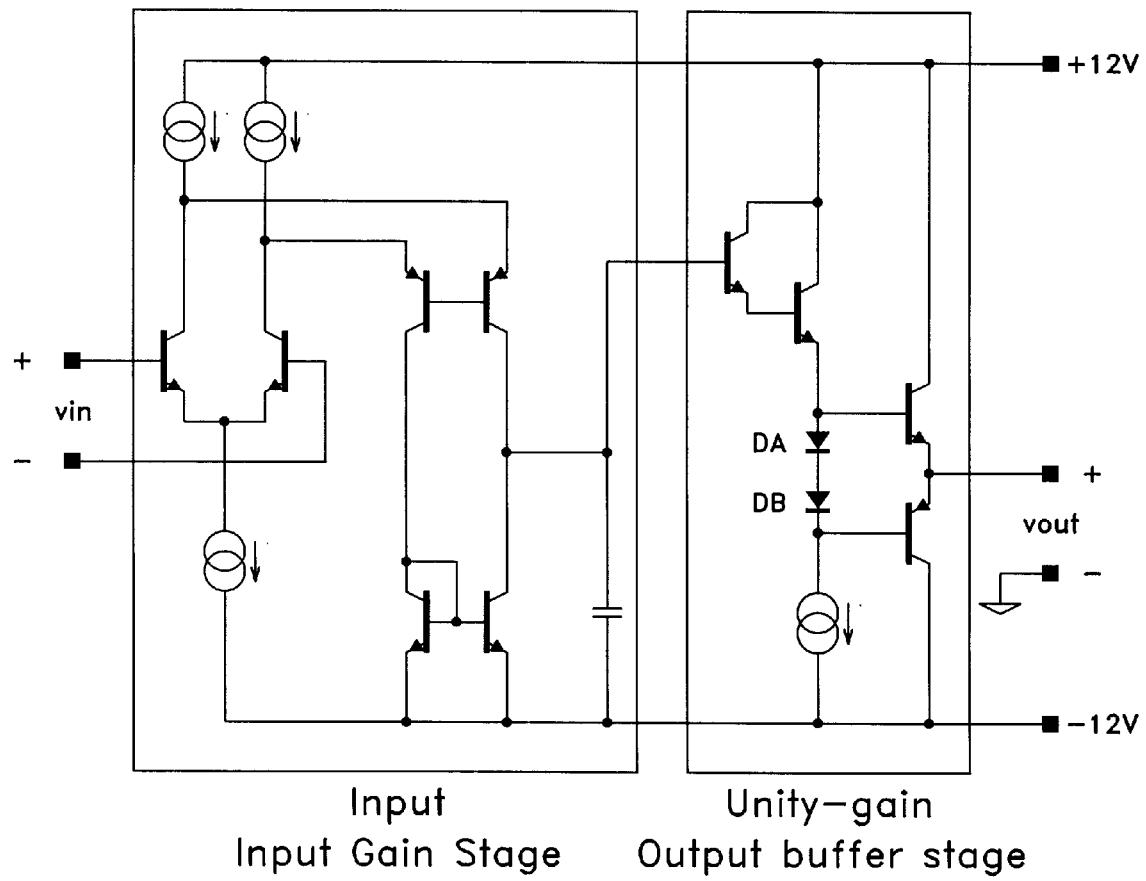
FIG. 1B illustrates one known, conventional implementation of the amplifier structure of FIG. 1A.

FIG. 1B shows a simplified design of the basic amplifier of FIG. 1A. The input gain stage includes conventional current sources, current mirrors, and buffer stages. FIG. 1B also shows a simplified unity-gain output buffer stage. The output from the unity-gain input stage is connected to the base of the first of a pair of Darlington-coupled NPN input transistors Q1, Q2 in the output buffer stage. The collectors of these transistors are connected to a positive voltage supply of, for example, +12 V. The emitter of transistor Q2 is connected to a negative power supply of, for example, −12 V, via a pair of bias diodes DA, DB, and a current source. The diodes DA, DB are included to help reduce crossover distortion. The bases of two emitter-connected output transistors Q3, Q4 are connected on respective sides of the diodes DA, DB, and the emitter voltage of Q3, Q4 is taken as the output from the entire two-stage system.

Figure 1C:
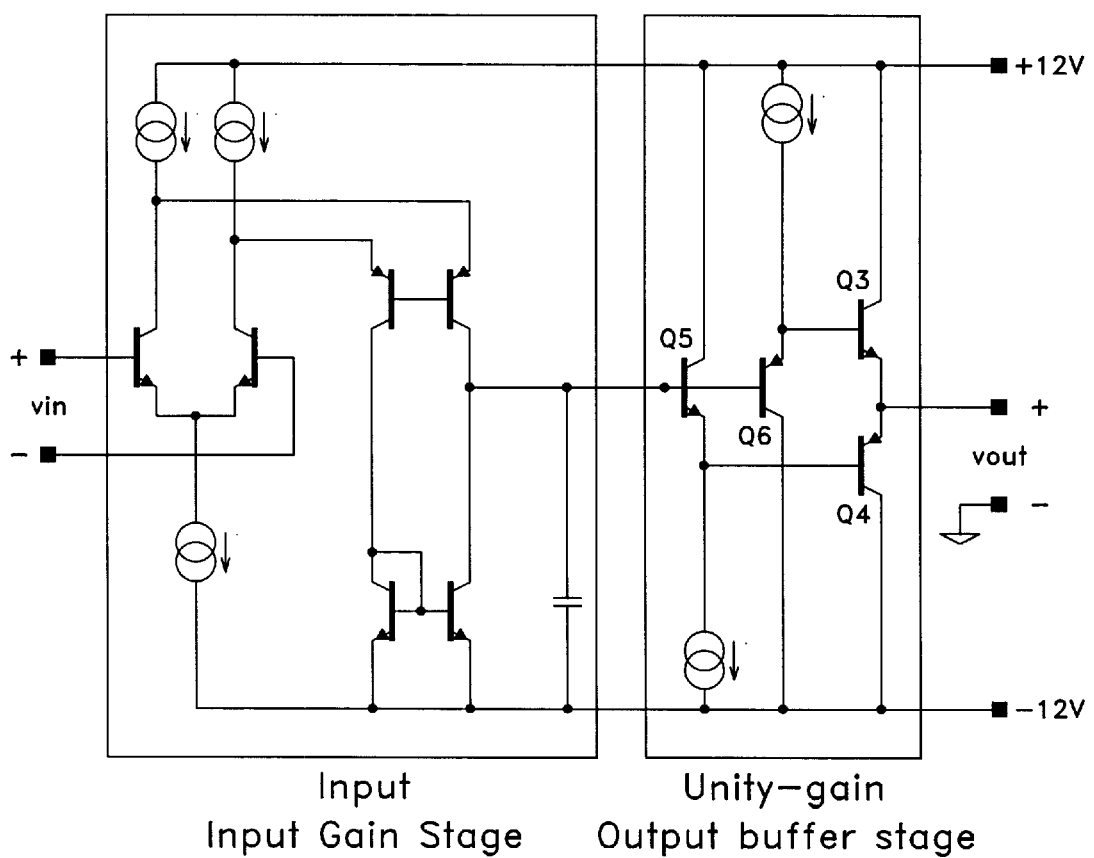
FIG. 1C illustrates another conventional implementation of the amplifier structure of FIG. 1A, but with a different implementation of the unity-gain output buffer stage.

FIG. 1C illustrates a modification of the conventional two-stage power amplifier of FIG. 1B. In this modified design, the Darlington-coupled transistors Q1, Q2 as well as the diodes DA, DB are replaced by a single pair of base-connected input transistors Q5, Q6, whose emitters are coupled to the bases of the output transistors Q3, Q4, respectively. Although this design eliminates the diodes DA, DB, it does so at the cost of including separate current sources in the emitter-to-supply paths of the input transistors Q5, Q6.

The designs shown in FIGS. 1B and 1C are well understood and are described in detail in, for example, "Bipolar and MOS Analog Integrated Circuit Design," Alan B. Grebene, John Wiley & Sons, (Wiley-Interscience Publication), 1984. They are therefore not described further here. What is important to note, however, is that in both of these conventional designs, all output current from the buffer stage is derived from a single positive supply and a single negative supply, for example, +12 V and −12 V. This leads to the disadvantages described above.

General System According to the Invention

Figure 2:
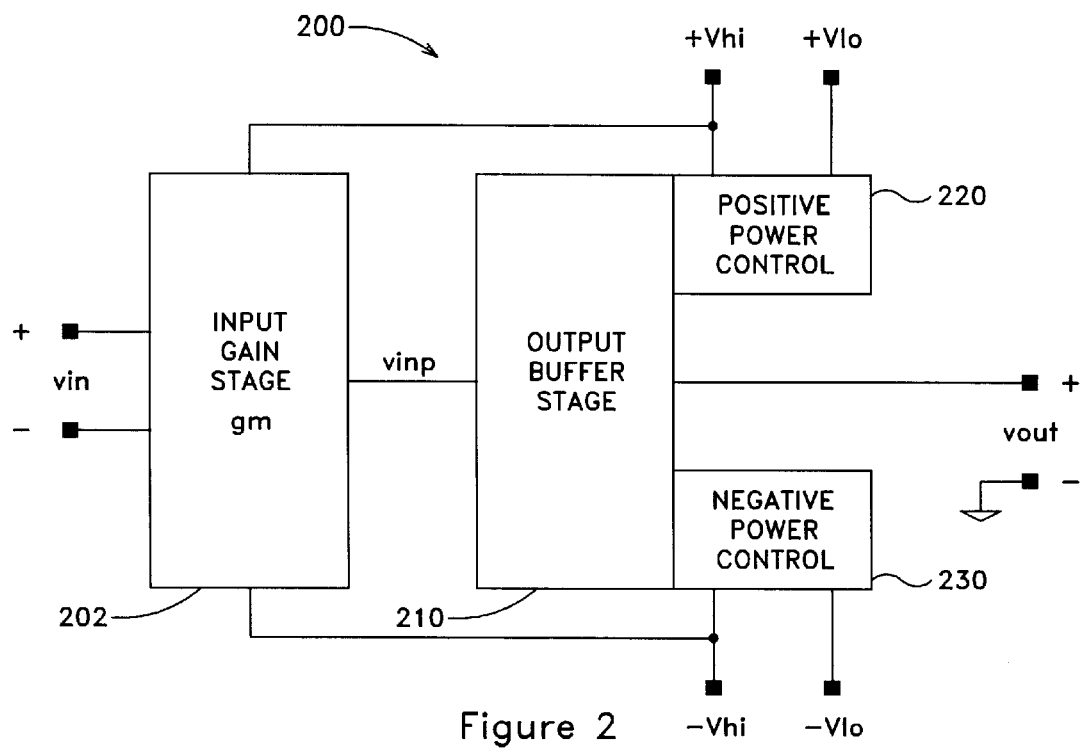
FIG. 2 is a simplified block diagram of the bipolar monolithic operational amplifier of the present invention.

FIG. 2 illustrates the major circuit sections of the two-stage, high-power, monolithic, integrated circuit (IC) power amplifier according to the invention. The circuit as a whole, including both stages and power supplies and controllers (described below) is indicated generally by reference number 200. The invention includes an input gain stage 202, which may be designed as in any conventional circuit, for example, the input gain stage shown in both FIGS. 1B and 1C. The output of the input stage 202 is connected as an input signal Vinp to an output buffer stage 210.

In most applications of the invention, the output stage is to have unity gain. This is natural, since this stage acts primarily as a buffer, and the proper amplification of the system input signal Vin can be accomplished simply by setting the gain gm of the input stage. One could also, however, design the output stage to have other than unity gain if for some reason this is desirable. The necessary design changes be obvious to those skilled in the art of monolithic operational amplifiers.

A positive power control circuit 220, which is preferably, but not necessarily, simply implemented as part of the output buffer stage, is included to switch the driving of the positive output driver supply current between a relatively high-valued positive voltage supply +Vhi and a relatively low-valued positive voltage supply +Vlo. A negative power control circuit 230, which is analogous but of reverse polarity to the positive power control circuit 220, is preferably included to switch the negative output driver supply current between a relatively high-valued negative voltage supply −Vhi and a relatively low-valued negative voltage supply −Vlo.

In most embodiments of the invention, +Vhi and +Vlo have the same magnitudes as −Vhi.and −Vlo, respectively. This is preferable since input signals in most applications will usually have the same positive and negative voltage ranges, but it is not required by the invention. Design changes to provide unipolar operation will be obvious to those skilled in the art of integrated circuit design.

Moreover, in the most common expected application of the invention, namely, in ADSL amplification circuitry, +Vhi and −Vhi will be +12 V and −12V, respectively. These exact voltages are not required according to the invention. This maximum voltage is generally also used for the system as a whole; accordingly, +Vhi and −Vhi are connected to drive the input gain stage 202 as well. On the other hand, if for some reason a different (especially smaller) voltage range is required in the input stage than the output buffer stage, then different supply voltages may be provided.

It is not necessary to include both positive and negative voltage supplies, as well as a ground, in every application of the invention. In some circuits, for example, only a positive or only a negative power supply would suffice, in which case only the positive or negative power control circuit would need to be included. Alternatively, the negative (or positive) voltage level could form the system "ground," with both power control circuits still included. The configuration will depend on the needs of a given application of the invention. The analysis and functioning of such circuits will be essentially the same as described below; any required changes will be obvious to those skilled in the art of monolithic circuit design.

The invention reduces the power needed to drive the amplifier by providing both high and low voltage supplies, and switching to the higher voltage only as needed. The lower voltages +Vlo and −Vlo may also be selected using normal design considerations. In most bipolar circuitry, however, voltages of ±5 V are commonly used for driving typical components. The values ±Vhi=±12 V and ±Vlo=±5 V are therefore assumed in the description of the preferred embodiment below.

Preferred Implementation of the Invention

Figure 3:
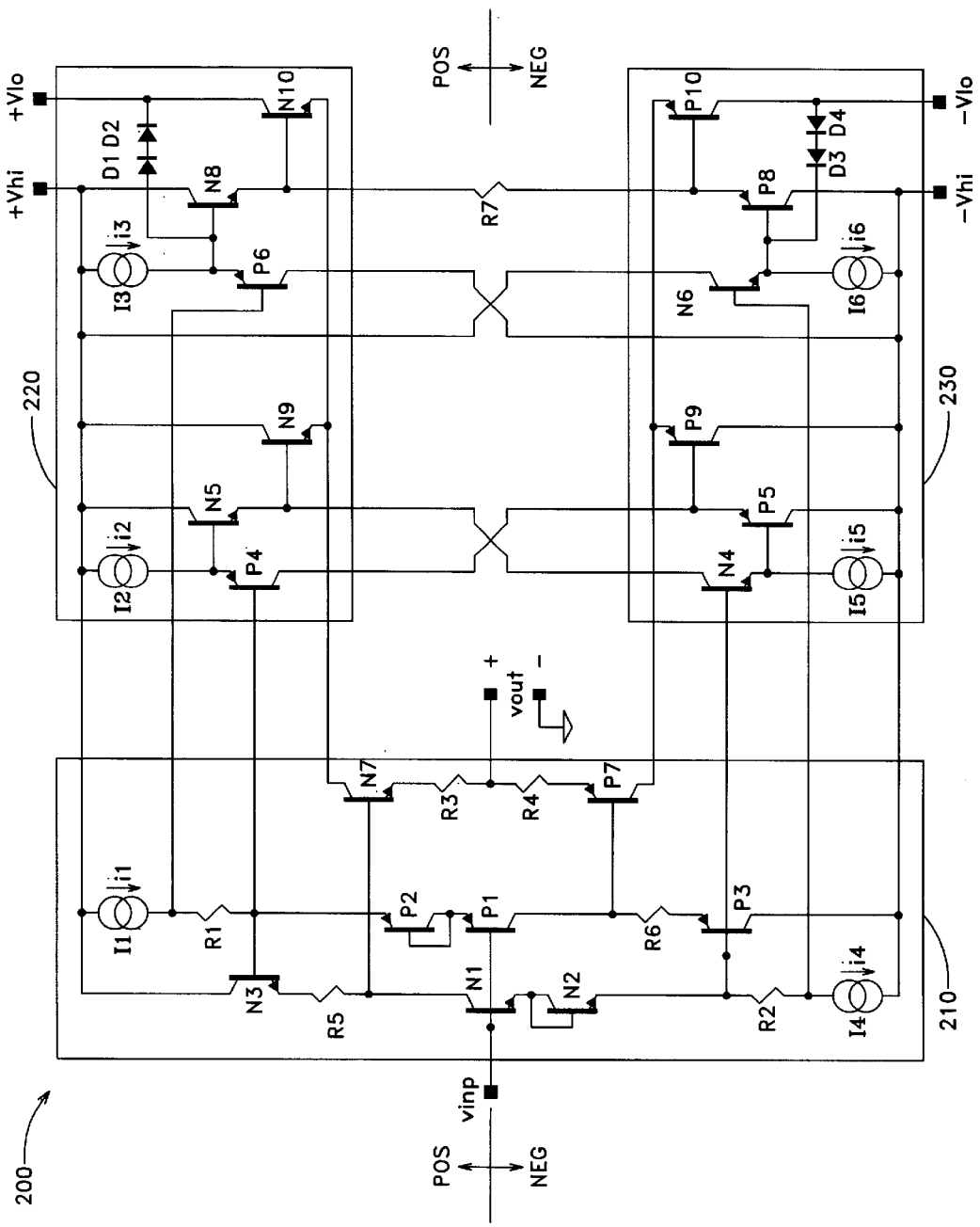
FIG. 3 is a simplified schematic diagram of the output buffer stage with positive and negative power control circuits according to the invention.

FIG. 3 is a block diagram illustrating the preferred embodiment of the invention, with the buffer stage within the block 210, and the positive and negative power control circuits within blocks 220 and 230, respectively. In FIG. 3, conventional monolithic, bipolar NPN and PNP transistors are indicated with reference designations as Nk and Pk, respectively, (k=1, 2, ... ). Conventional current sources and resistors are similarly indicated as ik and Rk, respectively, (k=1, 2, ... ).

As is well known, the voltage drop (or rise) over a standard PN junction is roughly 600–800 mV, depending on operating parameters such as temperature (and thus on how much current is passing through the junction). All of the transistors used in the preferred embodiment of the invention are preferably fabricated on the same substrate, so that the voltage drop over any junction can be assumed to be nearly the same in magnitude as that over any other junction operating at approximately the same current density. Thus, the base-emitter voltage drop can be assumed to be approximately the same for all transistors operating at the same current density in the invention. The conventional fabrication process for monolithic circuits such as the bipolar amplifier of this invention will almost always justify this assumption. In the rare cases when it does not, then the necessary changes to the circuitry of the invention will be obvious to those skilled in art, especially in light of the description of the various voltage levels (and their relationships) created within the preferred embodiment of the invention, and how they are used.

In the following description, the magnitude of the junction voltage drop is referred to as a constant, D. It is to be understood, however, that D is actually a function of, among other things, current density and temperature. However, any change will in general either be negligible, or irrelevant to the operation of the circuit.

The circuit as shown is divided into a positive "side" (labeled POS, above the dash-dotted line) and a negative "side" (labeled NEG, below the dash-dotted line). This is for ease of understanding only, since the two different portions of the circuit have identical or functionally identical components and connections, and operate identically, except for reverse polarities of supply voltages and bipolar components. Thus, for each transistor NPN transistor on the positive side, there is a corresponding transistor PNP transistor on the negative side, and vice versa. Thus, N9 corresponds to P9, P2 corresponds to N2, and so on. The analysis of the NEG side of the circuit can thus be done in exactly the same way as for the POS side described in detail below.

The connections of the various components shown in FIG. 3 for the preferred embodiment of the invention are as follows. The input voltage signal Vinp is connected to the base of two different input transistors N1 and P1. On the positive side of the circuit, the relatively higher positive voltage supply +Vhi is connected to the collectors of transistors N3, N5, N9, and N8, and also supplies current sources 11, 12, and 13 which generate currents i1, i2, and i3, respectively. The relatively lower positive voltage supply +Vlo is connected to the collector of transistor N10, and to the n diffusion of diode D2. The collector of N1 is connected, via a resistor R5, to the emitter of N3, and, directly, to the base of N7. The output of the current source 11 is connected directly to the base of P6 and, via resistor R1, to the base of N3, the emitter of P2, and the base of P4. Transistor P2 is diode-connected, that is, its base and collector are connected. The base/collector of P2 are connected to the emitter of P1.

The transistor N3 is, as FIG. 3 shows, preferably connected as an emitter follower driving the output transistor N7 though R5. The N3 base is connected, via the diode-coupled transistor P2, to the emitter of P1. Relative to the input signal Vinp, the N3 base will be roughly two base-emitter voltage drops (approximately 1.4 V) higher, which is a suitable level for driving the output transistor N7. One other advantage of including N3 as illustrated is that the collector current of N1 is also supplied to the emitter of N3. This reuse of the N1 collector current further reduces the demand for power supply current in the buffer circuit.

The base voltage of N3, which is the same as the emitter voltage of P2, is suitable for driving the base of P4, which is the input transistor for the first or high-voltage section of the positive power control circuit. An additional voltage i1·R1 is developed across R1 so that the voltage at the connection between I1 and R1 is suitable for driving the second, or low-voltage section of the positive power control circuit. Note that this additional voltage is just the difference between the control voltages applied to the first and second sections of the positive power control circuit.

Within the positive power control circuit 220, the output of the second current source 12 is connected to the emitter of P4, and to the base of N5. The output of the third current source 13 is connected directly to the base of N8 and the emitter of P6, and, via the series-coupled diodes D1 and D2 to the +Vlo supply. The collector of N10 is also connected to the +Vlo supply. The emitter of N5 is connected to the base of N9; similarly, the emitter of N8 is connected to the base of N10.

The emitters of both N9 and N10 are both connected to the collector of the positive-side output transistor N7, and thus to each other. The connection of the N9 and N10 emitters to the collector of the output transistor N7 forms a positive regulator bus. This is important to note, since N9 and N10 are the transistors through which the respective high and low positive power supplies +Vhi and +Vlo are connected to the regulator bus, and thus to the collector of the output transistor N7. Note also that the various connections of I2, P4, N5 and N9 are the same as the corresponding connections of 13, P6, N8 and N10, and that these two sub-circuits control the connection of +Vhi and +Vlo, respectively, to the collector of N7. These two sub-circuits thus form high- and low-voltage control circuits within the positive power control circuit 220. As is explained below in greater detail, P4 and P6 are the input transistors to these respective sub-circuits; N9 and N10 form analog switching or regulating elements controlling the amount of current drawn from +Vhi and +Vlo, respectively.

Note, however, that even though the collector of N7 is connected to the regulator bus and thus receives current drawn from either +Vhi or +Vlo, all current to the base of N7 is drawn exclusively from the relatively higher supply +Vhi, which is the sole voltage source for the buffer stage 210. The collector and emitter of the output transistor N7 thus form input and output terminals, respectively. The input terminal is connected to the "switched" power supply, whereas the base of N7, which forms a current control terminal, receives its control current through N3 solely from the single, unswitched, stable source +Vhi.

Note that the collector current of P4 can be used to supply the emitter current of P5 by connecting the collector of P4 to the emitter of P5. The same is true for N4 and N5 by connecting the collector of N4 to the emitter of N5.

The voltage drop between the emitters of N8 and P8 is relatively constant and a few Volts in magnitude. An approximately constant current bias of a few hundred microamps is therefore established by connecting R7, with a value of approximately 10 kOhms, between the emitters of N8 and P8.

The collector of P6 is connected to the negative −Vhi power supply, while the collector of N6 is connected to the positive +Vhi supply.

Finally, the emitter of N7 is connected, via a resistor R3 to the positive output terminal Vout, whose negative terminal is circuit ground. This resistor is preferably included solely to reduce the quiescent bias current through N7, and can be adjusted to reduce second harmonic distortion. It will typically have a very small value—in one prototype of the invention, R3 had a value of only 0.1 Ohms. Note that the value for the compensation resistor R4 for the PNP transistor P7 may be somewhat different than that needed for an NPN transistor such as N7. In the same prototype of the invention, the resistor R4 had the same value as R3, that is, 0.1 Ohms. The proper values for R3 and R4 can be determined using design methods that will be discussed later with regard to reducing second harmonic distortion.

The connections of the various voltage supplies, current sources, and components on the negative side of the circuit are "mirrored" with respect to those on the positive side, but with reverse polarities. The exact connections are therefore not described separately.

Yet another advantageous feature of the invention is that it operates to maintain a substantially constant collector-to-emitter voltage on the output transistor N7. In order to simplify the explanation of this feature of the invention, introduce the following notation:

VN7ce is the collector-to-emitter voltage on the output transistor N7.

DNi is the voltage drop (the "diode drop") from the base to the emitter of transistor Ni;

DPi is, similarly, the voltage or "diode" drop from the base to the emitter of Pi.

The nature of these voltage drops is well understood in the field of bipolar design.

Now because N7 is an output transistor, its base-emitter diode drop DN7 gets to be quite large when N7 is driving a very high current. Part of the reason for this is that N7, as is typical for a bipolar transistor, includes approximately a hundred Ohms of base resistance and may conduct three or four milliamps of base current; this leads to an increase in the external base-emitter voltage of N7 having a total drop approaching 1.2 V, that is, a little more than the 800 mV intrinsic base-emitter diode drop.

Note, however, that in the embodiment of the invention shown in FIG. 3, the base-emitter diode drop for whichever switch transistor is "active" (conducting), that is, DN10 for N10, or DN9 for N9, will be comparable to the drop DN7. Likewise, for whichever transistor N8 or N5 is conducting, its corresponding voltage drop DN8 or DN5, will be comparable to DN3.

The resistor R5, which is in series with the base of N7, also contributes a voltage drop DR5. In the preferred embodiment of the invention, however, R5 may be small, such as 10 Ohms, so that its added voltage drop, considering that the R5 current is at most a few milliamps, is only a few tens of millivolts. The primary purpose of resistor R5 is to lower the quiescent bias voltage across N7 to reduce its quiescent or idling current.

In order to better understand the general circuit concepts employed, consider now the two different signal paths from the emitter of N7 to the collector of N7. Note that the one path is via N10, which controls the connection of the +5V (+Vlo) lower power supply to the output transistor N7, while the other path is via N9, which controls the connection of the higher power supply +Vhi to the output transistor N7.

The low-power control path, the voltage change at each step, and the approximate total voltage change above are as follows. Note that it can be assumed that DN7=DN9=DN10, and that DN3=DN5=DN8, since any differences will be small enough to be negligible, even over large current ranges; furthermore, the voltage across R5 (DR5) is small enough to be negligible. Thus:

| Path | Voltage change |
| --- | --- |
| from the emitter to the base of N7, | +D |
| from the base to the emitter of N3, | +D |
| across the resistor R1, | +(R1 · i1) |
| from the base to the emitter of P6, | +DP6 |
| from the base to the emitter of N8, and, finally, | −D |
| from the base to the emitter of N10. | −D |
| Total Voltage Change Over Whole Path: | (R1 · i1) + DP6 |

(VN7ce: from the N7 emitter to the N7 collector)

Similarly, the high-power control path, the voltage change at each step, and the approximate total voltage change are as follows:

| Path | Voltage change |
| --- | --- |
| from the emitter to the base of N7, | +D |
| from the base to the emitter of N3, | +D |
| from the base to transistor emitter of P4 | +DP4 |
| from the base to the emitter of N5, | −D |
| from the base to the emitter of N9, | −D |
| Total Voltage Change Over Whole Path: | +DP4 |

(VN7ce: from the N7 emitter to the N7 collector)

In the illustrated, preferred embodiment of the invention, P6 is operated under identical bias current conditions as P4, and i2=i3. DP6 is therefore approximately equal to the DP4. The voltage change over the high-power control path is therefore VN7ce=+DP4 and the voltage change over the low-power control path is VN7ce=DP4 +(i1·R1). Because DN5 and DN9, on the one hand, and DN3 and DN7, on the other hand, increase dynamically and approximately equally with increasing output drive current, this means that the two paths within the power control circuit 220, which act as two separate voltage regulators, attempt to maintain VN7ce substantially constant.

For both paths, the total voltage changes are the voltages at the respective points above the emitter of N7. Thus, transistor N9 will always try to keep the collector voltage of N7 +D Volts higher than the emitter voltage. The voltage rise across the base-emitter junction of P4 should provide enough voltage headroom to prevent N7 from saturating. The design of N7 to have suitably low base, emitter, and collector resistances is known in the art. The main purpose of P4 and P6 is thus to set the minimum voltage headroom— the lowest collector-to-emitter voltage—for the output transistor N7. The transistors P4 and P6 thus operate as voltage level-shifting transistors. An alternative way to provide voltage level-shifting for headroom adjustment would be to use a combination of a constant current generator and a resistor. Moreover, if additional voltage headroom is required above that already provided for by P4 and P6, then one could simply insert an additional resistor between R1 and the node connecting R1 to N3/P2; one should then move the P4 base connection to the junction of the two resistors. In one implementation of the invention, a headroom of 600 mV was provided. The transistor N1 will attempt to maintain an N7 collector voltage that is (R1·i1)+D above the emitter voltage. The values for R1 and i1 will thus determine the additional N7 collector-emitter voltage, which the low-voltage switch attempts to supply over the high-voltage switch.

Now in order to better understand the improvements representative of the invention, note the following: First, if R1=0, then both the +12V (+Vhi) and +5V (+Vlo) circuits would attempt to supply the same current, through N9 and N10, respectively, since the voltage at the base of both of these transistors would be the same. As R1's value is increased, however, the base of transistor N10 will be at a voltage level=(R1·i1) higher than that at the base of N9; N10 will, consequently, provide more of the current to the output transistor N7, enough to maintain an emitter voltage of (R1·i1)+D (roughly 800 mV) above the emitter voltage of the output transistor N7. In order better to understand this, consider the following example.

Assume the following values, which are those used in a prototype of the invention:

i1=0.5 mA; i2=0.25 mA; i3=0.25 mA; R1=440 Ohms

This means that the emitter voltages of N9 and N10 will be 600 mV and 800 mV, respectively, above Vinp. As long as N10 is operating in the normal active region, it will thus be supplying an emitter voltage 200 mV above the emitter voltage of N9. Now if N8 and N10 were not included, N9 would attempt to provide an emitter voltage 600 mV above the N7 emitter voltage. N9's base voltage, assuming a standard base-emitter voltage change of 800 mV, would then be approximately 1400 mV above the N7 emitter voltage. However, the base voltage of N10 would be approximately (R1·i1) higher than that of N9.

It is known that the current through a bipolar device such as N9 drops roughly a full decade for every 60 mV reduction in its base-emitter voltage. In the case of N10 supplying an emitter voltage 200 mV higher than that of N9, this translates into a reduction in through-current of 200/60= (approximately) three decades. In practice, the lower current demand on N5 will reduce this figure to around two decades, but even so, this represents a reduction in supplied current by N9 by some two orders of magnitude. In other words, as long as N10 is operating in its active region, then only negligible current flows through N9; in short, N10 "shuts off" N9.

Assume now that the demand for output current rises. Transistor N10 will continue to block N9 (N10's emitter voltage will remain above N9's emitter voltage and will continue to supply most of the output current) until the N10 emitter voltage rises to within about a few hundred millivolts the +Vlo supply voltage. If this level is exceeded, then diodes D1 and D2 will prevent a further rise of the N8 and N10 base voltages; N10 will thus saturate, and will no longer be able to provide an emitter voltage sufficient to block N9, at which point N9 will begin to supply current, but now from the +Vhi (for example, +12V) voltage supply. In effect, N9 will supply all the N7 current as long as the voltage demand is this high. As the output voltage demand drops, N10 will leave its saturated state and will once again block N9 and supply current from the lower voltage supply.

It has been found in practice with typical ADSL applications, that the voltage demand rises high enough to require supply from the +12V source only a few percent of the time; this will generally occur only when the load voltage zero-to-peak value exceeds around 3.5 V. This means that conventional systems, which use only the single +12V source, are providing this large headroom in order to deal with a voltage demand that does arise, but with a small duty cycle. As is mentioned above, this also means that it is constantly supplying well over a Watt (typically, more than 1.4 W) for each and every driver pair in the central office. Because the lower voltage supply, via N10, will be providing the current most of the time in the invention, that is, with a high duty cycle, the average power in the output stage is less than 1.0 W. Thanks to the supply switch-over enabled by the N9/N10 interaction, no large, fixed voltage headroom is required.

Because the lower voltage supply (+Vlo, for example, +5V) is at less than half the voltage of the higher supply (+Vhi, for example, +12V), the power dissipated from the quiescent or idling current of the output stage is reduced by more than half. Thanks to this reduction, higher idling current may be allowed and therefore lower distortion is possible. In one prototype of the invention, for example, the 20 dBm output average power from the circuit was approximately (4×3 mA×12 V)=144 mW for the portions of the power control circuit at the 12V voltage supply, and approximately (4×32 mA×5 V)=640 mW for the portions of the power control circuit at the 5V voltage supply. The total power required was thus only 144+640=784 mW, which is only about half of the 1.5 W normally required, and in any case well under 1.0 W. Because the driver stage N8 is supplied base current from the high voltage supply +Vhi, no large headroom is required between N10 and the Vlo supply and the base of N10 may actually rise above the Vlo supply.

As is explained above, the resistor R1, given the current generator 11, is used to "tune" the voltage level of the N10 emitter in order to establish a voltage gap above the emitter voltage of N9. This presents a trade-off: The higher R1 is, and, thus, the higher the voltage difference is, the faster the circuit will switch over from drawing current from the low-voltage supply to drawing current from the high-voltage supply. On the other hand, the faster N10 goes into saturation and N9 "takes over," the more noise is introduced into the output signal. The proper level for R1 can be determined using conventional design methods. Experiments indicate that a value in the range 200–300 mV for (R1·i1) will allow switch-over fast enough to allow the circuit to be used even for high-frequency ADSL applications, with noise levels low enough to be acceptable in most normal cases. It has also been found that the power control circuit(s) provides a relatively smooth change in collector-to-emitter voltage supplied to the output devices in the output stage when the switching action is accomplished. The change in voltage is on the order of a few hundred millivolts.

The voltage at resistor R1 and the transistor P6 tend to drive the transistor N8 toward the +Vhi voltage supply. If the emitter of N8 were to raise the base of N10 substantially above 5V, however, then the base-collector junction of N10 would become forward-biased, and the base would then accumulate a high charge. In the illustrated embodiment of the invention, diodes D1 and D2 are therefore included to shunt the i3 "drive" current and thus to prevent N8 from driving N10 into saturation.

This implementation of the invention also has advantages from the standpoint of fabrication. In the preferred embodiment of the invention, the designs of N3 and N7 are different in that they are constructed with different multiples of drain sinker fingers. As is well known in the art, in designing monolithic bipolar ICs, one usually wishes to maintain about the same maximum current density in each device. The maximum current for N7 will normally be about 360 mA, which means that N7 is preferably implemented using two devices of 34 collector fingers each. On the other hand, the driver N3 is preferably constructed from just a single one-finger device, since it has to handle only about 1/100 of the output current, that is, about 2–3 mA maximum. This practice is well understood in the art—in bipolar design, one includes just enough multiples of the output N7 or source-follower driver N3 device emitter, collector, and sinker fingers to assure proper maximum current density and voltage drops.

In the preferred implementation of the invention, even if N7, P7, N9, P9, N10, and P10 are fabricated with many fingers (more than 60), then all the other transistors may have just one. In addition, the devices P4, N4, P6 and N6 have relatively small and approximately constant currents, so that they may not even require drain switches; this allows them to have even lower capacitance.

If either one of the transistor N3/N7 or P3/P7 transistor pairs is stronger than the other, then it will require less base voltage at either the base of N3 or P3 to drive the output to the same current in each direction. In other words, for equal drive voltages at the bases, the output may rise to a higher potential in one polarity. This will result in output waveform distortion commonly known as second harmonic distortion.

This second harmonic distortion can be reduced in the invention by increasing R5 if the cause is the base resistance of N7 being lower than the base resistance of P7, or by increasing R3 if the emitter resistance of N7 is lower than the emitter resistance of P7. As is explained above, the circuitry in both the high- and low-voltage control sub-circuits within the power control circuit 220 operate to provide a relatively constant collector-to-emitter voltage to N7 despite adjustments to R3 or R5. Indeed, VN7ce is independent of R3, since any voltage across R3 just adds to the voltage that is sent to the positive power control at either end of R1. If R5 is increased to help compensate for lower N3 than P3 base resistance, then VN7ce is actually increased by the increased drop across R5. But DR5 is negligible; therefore, the increased drop does not increase VN7ce appreciably.

The invention thus makes it possible to compensate for second harmonic distortion by adjusting R3 or R5 (and their negative-side counterparts R4 and R6). The power circuit as a whole will still work well without significantly reducing the voltage headroom by increasing particularly R3 and R4. A 0.3 ohm increase in R3 could, for example, use up only 100 mV of headroom under a peak load of 360 mA. The proper values of R3 and R5 can therefore be chosen in any given implementation of the invention using normal experimental and design methods.

In the embodiment illustrated in FIG. 3, the collector of P4 is connected to the emitter of P5; thus its current is re-used. This is done to save power. The collector of P6 is returned to the negative power supply −Vhi to insure that P6 will never drop into saturation with high negative signal amplitudes. A resistor R7 may be included to connect the emitters of transistors N8 and P8, as the voltage difference will usually be in the range of 2 V. In the prototype of the invention described here, R8 was chosen to be 10 kOhms.

Figure 4:
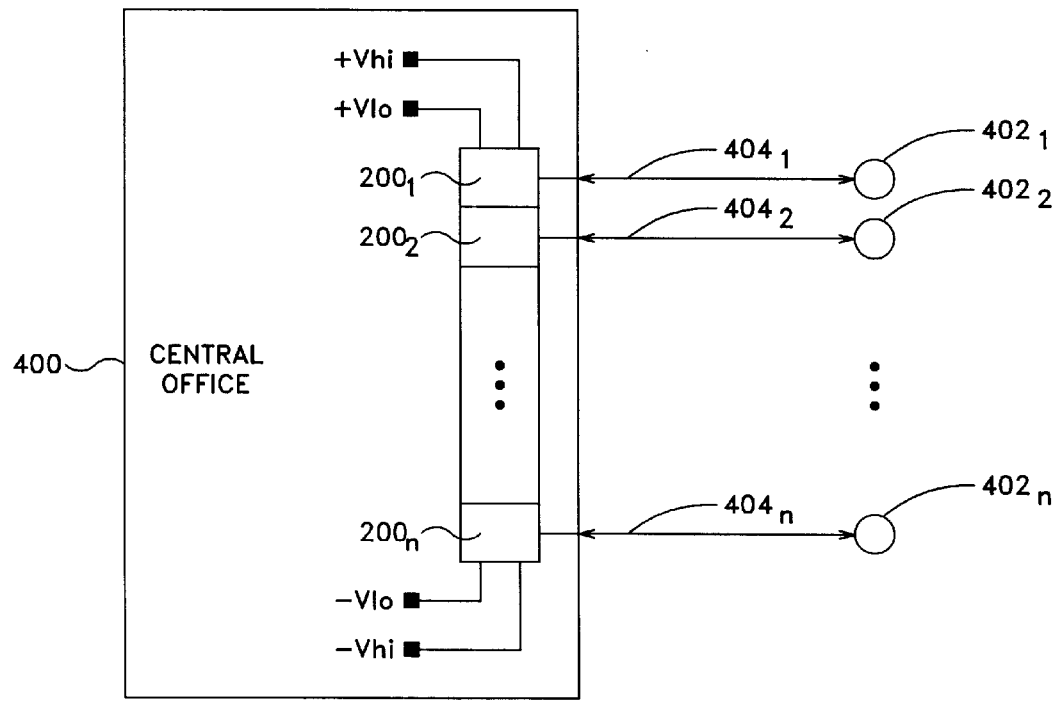
FIG. 4 illustrates a system incorporating several of the amplifiers according to the invention to connect a central system, such as an ADSL central office, to a plurality of customer systems.

FIG. 4 shows the invention in use in a system in which a central system 400 is in communication with a potentially large number of customer systems $402_1$, $402_2$, ..., $402_n$, over connectors $404_1$, $404_2$, ..., $404_n$. In telecommunications systems following the ADSL standard, for example, the central office system might be a large system with thousands of ADSL transceivers, and the customer systems could be personal computers with built-in transceivers, or some combination of these or similar systems. The connectors might then be electrical conductors, such as twisted-pair copper cables. In this system, respective integrated circuit (IC) power amplifiers $200_1$, $200_2$, ..., $200_n$ according to the invention are included in the central system 400 to drive the output from the office to each customer system. The voltage supplies ±Vhi and Vlo± are then connected to each amplifier.

In the discussion of the invention above, the various transistors N1–N10 and P1–P10 are all described and illustrated as bipolar devices, in which the respective emitters and collectors function as first and second current terminals and their respective bases function as current control terminals. These concepts are well known in the art of bipolar design. The invention can also be implemented, however, using other semiconductors technologies besides bipolar. For example, if the transistors are implemented in MOS technology, such as FET transistors, the current terminals of each transistor would be the source and drain, corresponding to the bipolar emitter and collector, and the current control terminal would be the gate, corresponding to the bipolar base. Modifications of the rest of the amplifier according to the invention to adapt it to MOS technology will then be made using known design techniques.

I claim:

1. A monolithic integrated circuit amplifier having an input signal and an output signal comprising:

a gain stage that has a gain stage output signal and has, as an input, the amplifier input signal;

a buffer stage producing an amplifier output signal and having, as its input signal, the gain stage output signal;

an output stage, included within the buffer stage and having at least a first power output transistor that has first and second current terminals and a current control terminal;

a first and second voltage supply, the second voltage supply having a relatively higher magnitude than the first;

a first power control circuit connected to both the first and second voltage supplies, and to the output stage through a regulator bus;

the first power control circuit including
 a first switching means connected to the first voltage supply; and
 a second switching means connected to the second voltage supply;
 outputs of the first and second switching means both being connected to the regulator bus;

in which:
 when an output demand voltage is less than a predetermined switch-over threshold:
  current to the output stage is provided substantially entirely from the first voltage supply via the first switching means;
  the first switching means provides, via the regulator bus, a voltage at the second current terminal of the output transistor that is greater than the voltage at the first current terminal of the output transistor by a predetermined, substantially constant amount; and
  the voltage on the regulator bus itself blocks current output from the second switching means; and
 when the output demand voltage is greater than the switch-over threshold:
  current to the output stage is provided substantially entirely from the second voltage supply, via the second switching means; and
  the second switching means provides, via the regulator bus, a voltage at the second current terminal of the output transistor that is greater than the voltage at the first current terminal of the output transistor by the predetermined, substantially constant amount; and
  the voltage on the regulator bus itself blocks current output from the first switching means.

2. The amplifier as defined in claim 1 in which:
the first switching means includes:
 a first control transistor that has first and second current terminals and a current control terminal;
 a first analog switching transistor that has first and second current terminals and a current control terminal;
 a first voltage level-shifting means that has first and second current terminals and a current control terminal;
 a first current source connected to the second voltage supply and with an output connected to both the first current terminal of the first voltage level-shifting transistor and the current control terminal of the first control transistor;
 a second control transistor that has first and second current terminals and a current control terminal;
 a second analog switching transistor that has first and second current terminals and a current control terminal;

a second voltage level-shifting means that has first and second current terminals and a current control terminal;

a second current source connected to the second voltage supply and with an output connected to both the first current terminal of the second voltage level-shifting transistor and the current control terminal of the second control transistor;

in which:

the first current terminal of the first control transistor is connected to the current control terminal of the first analog switching transistor;

the second current terminal of the first control transistor is connected to the second voltage supply;

the first current terminal of the first voltage level-shifting transistor is connected to the current control terminal of the first control transistor;

the first current terminal of the first analog switching transistor is connected to the regulator bus;

the second current terminal of the first analog switching transistor is connected to the first voltage supply;

the first current terminal of the second control transistor is connected to the current control terminal of the second analog switching transistor;

the second current terminal of the second control transistor is connected to the second voltage supply;

the first current terminal of the second voltage level-shifting transistor is connected to the current control terminal of the second control transistor;

the first current terminal of the second analog switching transistor is connected to the regulator bus; and the second current terminal of the second analog switching transistor is connected to the second voltage supply.

3. The amplifier as defined in claim 2, in which the first and second voltage level-shifting means are level-shifting transistors, further including voltage headroom means for setting a voltage headroom, the voltage headroom being defined as the lowest voltage constantly available at the second current terminal of the output transistor relative to the first current terminal of the output transistor.

4. The amplifier as defined in claim 2, further including voltage difference-setting means, the voltage difference being defined as the difference between the voltage available at the second current terminal of the output transistor relative to the first current terminal of the output transistor in a first condition and a second condition, in which:

the first condition is when the voltage is being provided by current from the first analog switching transistor and the second condition is when the voltage is being provided by current from the second analog switching transistor.

5. The amplifier as defined in claim 4, in which the voltage difference-setting means includes:

the first and second control transistors;

first and second voltage level-shifting transistors, each having first and second current terminals and a current control terminal;

a third current source connected to the second voltage supply; and a resistor with a first and a second terminal and resistance R1, the first terminal of the resistor being connected to the third current source in parallel with the current control terminal of the first level-shifting means, the second terminal of the resistor being connected to the current control terminal of the second control transistor, the voltage level at the current control terminal of the first control transistor, relative to the voltage of the buffer stage input signal, thereby being maintained at a voltage higher than the voltage at the current control terminal of the second control transistor by a value substantially equal to the product of R1 and the current from the third current source.

6. The amplifier as defined in claim 2, in which the analog switching transistors, the control transistors, and the voltage level-shifting transistors are all bipolar devices, in which the first and second current terminals are emitter and collector terminals, respectively, and the current control terminals are base terminals.

7. The amplifier as defined in claim 2, in which the second current terminal of the second voltage level-shifting transistor of the first power control circuit is connected to the first current terminal of the second control transistor of the second power control circuit, and vice versa, the collector current of the second voltage level-shifting of each power control circuit thereby being made available and used within the other power control circuit.

8. The amplifier as defined in claim 7, further including, in the buffer stage, an output voltage terminal for both power control circuits;

for each power control circuit:

an output transistor that has first and second current terminals and a current control terminal;

an output resistor connected between the first current terminal of the output transistor and the voltage output terminal;

an emitter-follower transistor, which has a first and a second current terminal and a current control terminal and which is connected to the respective second voltage supply and forms emitter-follower means for the respective output transistor;

an output resistor connected between the first current terminal of the output transistor and the output voltage terminal;

an emitter-follower input resistor connected between the emitter-follower transistor and the current control terminal of the output transistor;

the output resistors and the emitter-follower resistors forming distortion-reducing means for reducing second harmonic distortion caused by any differences in resistances in the first current terminals and the current control terminals of the output transistors.

9. The amplifier as defined in claim 1, further including voltage headroom means for setting a voltage headroom, the voltage headroom being defined as the lowest voltage constantly available at the output stage relative to the voltage of the input signal of the buffer stage.

10. The amplifier as defined in claim 1, in which:

the first and second voltage supplies comprise a first dual voltage supply;

the regulator bus connecting the first dual voltage supply to the output stage via the first power control circuit is a first regulator bus;

the amplifier further comprising:

a second dual voltage supply, including third and fourth voltage supplies having the same amplitudes but opposite polarity relative to the first and second voltage supplies, respectively; and a second power control circuit having the substantially identical components and connections but opposite polarities relative to the first power control circuit.

11. A monolithic integrated circuit amplifier having an input signal and an output signal comprising:

a gain stage that has a gain stage output signal and has, as an input, the amplifier input signal;

a buffer stage producing an amplifier output signal and having, as its input signal, the gain stage output signal;

an output stage, included within the buffer stage;

a first and second voltage supply, the second voltage supply having a relatively higher magnitude than the first;

a first power control circuit connected to both the first and second voltage supplies, and to the output stage through a regulator bus;

the first power control circuit including:
  a first switching means connected to the first voltage supply and having at least a first analog switching transistor that has first and second current terminals and a current control terminal;
  the first switching means further including at least a first control transistor that has first and second current terminals and a current control terminal, the first current control terminal being connected to the control terminal of the first analog switching transistor, the second current control terminal being connected to the second voltage supply; and
  voltage clamping means for limiting the voltage between the current control terminal of the first control transistor and the first voltage supply;
  a second switching means connected to the second voltage supply and including at least a second analog switching transistor that has first and second current terminals and a current control terminal;

the first current terminals of the first and second analog switching transistors both being connected to the regulator bus;

in which:
  when an output demand voltage is less than a predetermined switch-over threshold, current to the output stage is provided substantially entirely from the first voltage supply via the first switching means and the regulator bus;
  when the output demand voltage is greater than the switch-over threshold:
    current to the output stage is provided substantially entirely from the second voltage supply, via the second switching means; and
    the voltage clamping means is provided for limiting a maximum voltage on the current control terminal of the first control transistor, for thereby limiting the maximum voltage on the current control terminal of the first analog switching transistor, and thereby also for substantially preventing the flow of reverse current through the first and second current terminals of the first analog switching transistor.

12. The amplifier as defined in claim 11 in which:
  the first switching means includes:
    a first control transistor that has first and second current terminals and a current control terminal;
    a first analog switching transistor that has first and second current terminals and a current control terminal;
    a first voltage level-shifting transistor that has first and second current terminals and a current control terminal;
    a first current source connected to the first voltage supply and with an output connected to both the first current terminal of the first voltage level-shifting transistor and the current control terminal of the first control transistor;
    a second control transistor that has first and second current terminals and a current control terminal;
    a second analog switching transistor that has first and second current terminals and a current control terminal;
    a second voltage level-shifting transistor that has first and second current terminals and a current control terminal;
    a second current source connected to the second voltage supply and with an output connected to both the first current terminal of the second voltage level-shifting transistor and the current control terminal of the second control transistor;

in which:
    the first current terminal of the first control transistor is connected to the current control terminal of the first analog switching transistor;
    the second current terminal of the first control transistor is connected to the second voltage supply;
    the first current terminal of the first voltage level-shifting transistor is connected to the current control terminal of the first control transistor;
    the first current terminal of the first analog switching transistor is connected to the regulator bus;
    the second current terminal of the first analog switching transistor is connected to the first voltage supply;
    the first current terminal of the second control transistor is connected to the current control terminal of the second analog switching transistor;
    the second current terminal of the second control transistor is connected to the second voltage supply;
    the first current terminal of the second voltage level-shifting transistor is connected to the current control terminal of the second control transistor;
    the first current terminal of the second analog switching transistor is connected to the regulator bus; and
    the second current terminal of the second analog switching transistor is connected to the second voltage supply.

13. The amplifier as defined in claim 12, in which the analog switching transistors, the control transistors, and the voltage level-shifting transistors are all bipolar devices, in which the first and second current terminals are emitter and collector terminals, respectively, and the current control terminals are base terminals.

14. The amplifier as defined in claim 12, in which the second current terminal of the first voltage level-shifting transistor of the first power control circuit is connected to the first current terminal of the first control transistor of the second power control circuit, and vice versa, the collector current of the voltage level-shifting transistor of each power control circuit thereby being made available and used within the other power control circuit.

15. The amplifier as defined in claim 14, further including, in the buffer stage,
  an output voltage terminal for both power control circuits;
  for each power control circuit:
    an output transistor that has first and second current terminals and a current control terminal;
    an emitter-follower transistor connected to the respective second voltage supply and forming emitter-follower means for the respective output transistor;
    an output resistor connected between the first current terminal of the output transistor and the output voltage terminal;

an emitter-follower resistor connected between the emitter-follower transistor and the current control terminal of the output transistor;

the output resistors and the emitter-follower resistors forming distortion-reducing means for reducing second harmonic distortion caused by any differences in resistances in the first current terminals and the current control terminals of the output transistors.

16. The amplifier as defined in claim 11, in which the voltage clamping means comprises at least one diode junction forward-biased between the current control terminal of the first control transistor and the first voltage supply.

17. The amplifier as defined in claim 11, in which:

the first and second voltage supplies comprise a first dual voltage supply;

the regulator bus connecting the first dual voltage supply to the output stage via the first power control circuit is a first regulator bus;

the amplifier further comprising:
a second dual voltage supply, including third and fourth voltage supplies having the same amplitudes but opposite polarity relative to the first and second voltage supplies, respectively; and
a second power control circuit having the substantially identical components and connections but opposite polarities relative to the first power control circuit.

18. A monolithic integrated circuit amplifier having an input signal and an output signal comprising:

a gain stage that has a gain stage output signal and has, as an input, the amplifier input signal;

a buffer stage producing an amplifier output signal and having, as its input signal, the gain stage output signal;

an output stage, included within the buffer stage;

a first and second voltage supply, the second voltage supply having a relatively higher magnitude than the first;

a first power control circuit connected to both the first and second voltage supplies and to the output stage through a regulator bus;

the first power control circuit including:
a first switching means connected to the first voltage supply and having at least a first analog switching transistor that has first and second current terminals and a current control terminal, the first switching means further including at least a first control transistor that has first and second current terminals and a current control terminal, the second current terminal of the first control transistor being connected to the second voltage supply, and the first current terminal of the first control transistor being connected to the current control terminal of the first analog switching transistor; and
a second switching means connected to the second voltage supply, having at least a second analog switching transistor that has first and second current terminals and a current control terminal;

in which:
the first current terminals of the first and second analog switching transistors are both connected to the regulator bus;
when an output demand voltage is less than a predetermined switch-over threshold, current to the output stage is provided substantially entirely from the first voltage supply, via the first switching means and the regulator bus; and when the output demand voltage is greater than the switch-over threshold, current to the output stage is provided substantially entirely from the second voltage supply, via the second switching means and the regulator bus.

19. The amplifier as defined in claim 18 in which:

the first switching means includes:
a first control transistor that has first and second current terminals and a current control terminal;
a first analog switching transistor that has first and second current terminals and a current control terminal;
a first voltage level-shifting transistor that has first and second current terminals and a current control terminal;
a first current source connected to the first voltage supply and with an output connected to both the first current terminal of the first voltage level-shifting transistor and the current control terminal of the first control transistor;
a second control transistor that has first and second current terminals and a current control terminal;
a second analog switching transistor that has first and second current terminals and a current control terminal;
a second voltage level-shifting transistor that has first and second current terminals and a current control terminal;
a second current source connected to the second voltage supply and with an output connected to both the first current terminal of the second voltage level-shifting transistor and the current control terminal of the second control transistor;

in which:
the first current terminal of the first control transistor is connected to the current control terminal of the first analog switching transistor;
the second current terminal of the first control transistor is connected to the second voltage supply;
the first current terminal of the first voltage level-shifting transistor is connected to the current control terminal of the first control transistor;
the first current terminal of the first analog switching transistor is connected to the regulator bus;
the second current terminal of the first analog switching transistor is connected to the first voltage supply;
the first current terminal of the second control transistor is connected to the current control terminal of the second analog switching transistor;
the second current terminal of the second control transistor is connected to the second voltage supply;
the first current terminal of the second voltage level-shifting transistor is connected to the current control terminal of the second control transistor;
the first current terminal of the second analog switching transistor is connected to the regulator bus; and
the second current terminal of the second analog switching transistor is connected to the second voltage supply.

20. The amplifier as defined in claim 19, in which the analog switching transistors, the control transistors, and the voltage level-shifting transistors are all bipolar devices, in which the first and second current terminals are emitter and collector terminals, respectively, and the current control terminals are base terminals.

21. The amplifier as defined in claim 19, in which the second current terminal of the first voltage level-shifting transistor of the first power control circuit is connected to the first current terminal of the first voltage level-shifting transistor of the second power control circuit, and vice versa, the collector current of the voltage level-shifting transistor of each power control circuit thereby being made available and used within the other power control circuit.

22. The amplifier as defined in claim 21, further including, in the buffer stage, an output voltage terminal for both power control circuits;

for each power control circuit:

an output transistor that has first and second current terminals and a current control terminal;

an emitter-follower transistor connected to the respective second voltage supply and forming emitter-follower means for the respective output transistor;

an output resistor connected between the first current terminal of the output transistor and the output voltage terminal;

an emitter-follower resistor connected between the emitter-follower transistor and the current control terminal of the output transistor;

the output resistors and the emitter-follower resistors forming distortion-reducing means for reducing second harmonic distortion caused by any differences in resistances in the first current terminals and the current control terminals of the output transistors.

23. The amplifier as defined in claim 18, in which:

the first and second voltage supplies comprise a first dual voltage supply;

the regulator bus connecting the first dual voltage supply to the output stage via the first power control circuit is a first regulator bus;

the amplifier further comprising:

a second dual voltage supply, including third and fourth voltage supplies having the same amplitudes but opposite polarity relative to the first and second voltage supplies, respectively; and a second power control circuit having the substantially identical components and connections but opposite polarities relative to the first power control circuit.

* * * * *